United States Patent
Yoo et al.

(10) Patent No.: US 12,500,065 B2
(45) Date of Patent: Dec. 16, 2025

(54) SUBSTRATE PROCESSING METHOD

(71) Applicant: ASM IP Holding B.V., Almere (NL)

(72) Inventors: TaeHee Yoo, Bucheon-si (KR); SeWoong Jung, Hwaseong-si (KR)

(73) Assignee: ASM IP Holding B.V., Almere (NL)

( * ) Notice: Subject to any disclaimer, the term of this patent is extended or adjusted under 35 U.S.C. 154(b) by 0 days.

(21) Appl. No.: 17/694,297

(22) Filed: Mar. 14, 2022

(65) Prior Publication Data

US 2022/0301823 A1    Sep. 22, 2022

Related U.S. Application Data

(60) Provisional application No. 63/162,438, filed on Mar. 17, 2021.

(51) Int. Cl.
*H01J 37/32* (2006.01)
*H01L 21/02* (2006.01)

(52) U.S. Cl.
CPC .. *H01J 37/32082* (2013.01); *H01L 21/02211* (2013.01); *H01L 21/02274* (2013.01); *H01J 2237/334* (2013.01)

(58) Field of Classification Search
CPC ............ H01L 21/76; H01L 21/0228; H01L 21/02274; H01L 21/02164; H01L 21/32137; H01L 21/02; H01L 21/76837; H01L 21/76224; H01L 21/7632; C23C 16/45542; C23C 16/4554

USPC ........................... 438/622, 623, 624
See application file for complete search history.

(56) References Cited

U.S. PATENT DOCUMENTS

| | | | |
|---|---|---|---|
| 6,200,911 B1 | 3/2001 | Narwankar et al. | |
| 7,524,750 B2 | 4/2009 | Nemani et al. | |
| 9,023,731 B2 | 5/2015 | Ji et al. | |
| 9,685,320 B2 | 6/2017 | Kang et al. | |
| 10,381,219 B1* | 8/2019 | Ueda | H01L 21/02274 |
| 11,482,412 B2 | 10/2022 | Blanquart | |
| 2003/0096098 A1* | 5/2003 | Ovshinsky | H01L 21/02529 |
| | | | 136/258 |
| 2007/0243693 A1* | 10/2007 | Nemani | H01L 21/76224 |
| | | | 257/E21.546 |
| 2013/0210241 A1* | 8/2013 | LaVoie | H01L 21/02211 |
| | | | 257/E21.24 |
| 2017/0229337 A1 | 8/2017 | Park et al. | |
| 2018/0119283 A1* | 5/2018 | Fukazawa | C23C 16/34 |
| 2019/0333753 A1* | 10/2019 | Ueda | C23C 16/4554 |

FOREIGN PATENT DOCUMENTS

| | | | |
|---|---|---|---|
| CN | 108018539 | * | 11/2018 |
| WO | 2020/081367 | * | 4/2020 |

* cited by examiner

*Primary Examiner* — Tabassom Tadayyon Eslami
(74) *Attorney, Agent, or Firm* — Snell & Wilmer L.L.P

(57) ABSTRACT

A substrate processing method capable of suppressing void formation includes supplying a silicon precursor on a pattern structure to form a silicon source layer having a first opening; and supplying plasma on the silicon source layer to volatilize constituents other than silicon included in the silicon source layer to enlarge the first opening.

18 Claims, 11 Drawing Sheets

SUBSTRATE PROCESSING METHOD

CROSS-REFERENCE TO RELATED APPLICATIONS

This application claims the benefit of U.S. Provisional Application No. 63/162,438, filed on Mar. 17, 2021, in the United States Patent and Trademark Office, the disclosure of which is incorporated herein in its entirety by reference.

BACKGROUND

1. Field

One or more embodiments relate to a substrate processing method, and more particularly, to a method of depositing a thin film on a pattern structure having a recess area or a gap area.

2. Description of the Related Art

As the degree of integration of semiconductor devices increases, the aspect ratio (A/R) of a pattern structure is also increasing. For example, as a depth versus width of an entrance of a gap structure increases, a technical difficulty of filling the gap structure without seams or voids is increasing. An atomic layer deposition method has the advantage of being able to deposit a film having a uniform thickness on the walls and bottom surfaces of the pattern structure. However, as the A/R of the pattern structure increases, it becomes increasingly difficult for a reactant gas to reach the bottom surface of the pattern structure during a short cycle time of supply/purge of the reactant gas. Thus, there is a problem that seams or voids remain in the thin film filled in the gap structure between pattern structures.

Various processes have been attempted to remove such seams or voids. For example, Korean Patent No. 10-2014-0083746 published on Jul. 4, 2014 discloses a void-free polysilicon gap-fill method and a technical idea to remove seams in polysilicon through a thermal process.

SUMMARY

One or more embodiments include a substrate processing method capable of filling a gap structure without seams or voids.

Additional aspects will be set forth in part in the description which follows and, in part, will be apparent from the description, or may be learned by practice of the presented embodiments of the disclosure.

According to one or more embodiments, a substrate processing method includes: providing a pattern structure having a first protrusion and a second protrusion; supplying a first source gas and first inert gas plasma on the pattern structure to form a first source layer on the pattern structure; and supplying hydrogen plasma on the first source layer to remove at least a portion of the first source layer, wherein each of upper surfaces of the first protrusion and the second protrusion has a flat portion and an edge portion surrounding the flat portion, and during the supplying of the hydrogen plasma, the first source layer on the edge portion may be removed more than the first source layer on the flat portion.

According to an example of the substrate processing method, the first source gas may include a silicon precursor.

According to another example of the substrate processing method, the silicon precursor may include an aminosilane-based silicon precursor, and the first source layer may include silicon, hydrogen, and carbon.

According to another example of the substrate processing method, as the silicon precursor, di-methyl divinyl silane (DMDVS) may be used.

According to another example of the substrate processing method, the first inert gas plasma may include a helium radical, and the helium radical may physically decompose the silicon precursor.

According to another example of the substrate processing method, during the forming of the first source layer, the silicon precursor may be decomposed into a silicon element, a ligand constituting a silicon precursor molecule, element fragments, and mixtures thereof by the helium radical.

According to another example of the substrate processing method, during the removing of at least a portion of the first source layer, the plasma intensity at the edge portion may be greater than the plasma intensity at the flat portion.

According to another example of the substrate processing method, during the removing of at least a portion of the first source layer, the number of collisions of the hydrogen plasma with the first source layer on the edge portion may be greater than the number of collisions of the hydrogen plasma with the first source layer on the flat portion.

According to another example of the substrate processing method, the surface roughness of the first source layer on the edge portion may be greater than the surface roughness of the first source layer on the flat portion.

According to another example of the substrate processing method, a recess surrounded by the first source layer may be formed by the forming of the first source layer, and an entrance of the recess may be enlarged by the removing of at least a portion of the first source layer.

According to another example of the substrate processing method, a peripheral portion of the first source layer may have a first curvature by the forming of the first source layer, and the peripheral portion of the first source layer may have a second curvature that is greater than the first curvature by the removing of at least a portion of the first source layer.

According to another example of the substrate processing method, the substrate processing method may further include forming a first gap-fill layer by supplying a first reactant gas on the first source layer.

According to another example of the substrate processing method, the substrate processing method may further include forming a second source layer by supplying a second source gas and second inert gas plasma on the first gap-fill layer.

According to another example of the substrate processing method, the second inert gas plasma may be different from the first inert gas plasma.

According to another example of the substrate processing method, the first inert gas plasma may be a helium radical, and the second inert gas plasma may be an argon radical.

According to another example of the substrate processing method, the substrate processing method may further include forming a second gap-fill layer by supplying a second reactant gas on the second source layer.

According to another example of the substrate processing method, the substrate processing method may further include removing at least a portion of the second source layer by supplying hydrogen plasma on the second source layer between the forming of the second source layer and the forming of the second gap-fill layer.

According to one or more embodiments, a substrate processing method includes: supplying a first source gas to form a first source layer; purging the first source gas;

supplying hydrogen plasma on the first source layer to remove at least a portion of the first source layer; purging the hydrogen plasma; forming a first gap-fill layer by supplying a first reactant gas on the first source layer after at least a portion of the first source layer is removed; purging the first reactant gas; forming a second source layer by supplying a second source gas on the first gap-fill layer; purging the second source gas; forming a second gap-fill layer by supplying a second reactant gas on the second source layer.

According to one or more embodiments, a substrate processing method includes: supplying a silicon precursor on a pattern structure to form a silicon source layer having a first opening; and supplying plasma on the silicon source layer to volatilize constituents other than silicon included in the silicon source layer to enlarge the first opening.

According to an example of the substrate processing method, the silicon source layer may have a central portion and a peripheral portion surrounding the central portion, wherein a first surface roughness of the peripheral portion is greater than a second surface roughness of the central portion, and during the supplying of the plasma, the number of collisions of the plasma with the peripheral portion having the first surface roughness may be greater than the number of collisions of the plasma with the central portion having the second surface roughness.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Expressions such as "at least one of," when preceding a list of elements, modify the entire list of elements and do not modify the individual elements of the list.

Hereinafter, embodiments of the disclosure will be described in detail with reference to the accompanying drawings.

In this regard, the present embodiments may have different forms and should not be construed as being limited to the descriptions set forth herein. Rather, these embodiments are provided so that the present disclosure will be thorough and complete, and will fully convey the scope of the present disclosure to one of ordinary skill in the art.

The terminology used herein is for describing particular embodiments and is not intended to limit the disclosure. As used herein, the singular forms "a", "an", and "the" are intended to include the plural forms as well, unless the context clearly indicates otherwise. It will be further understood that the terms "includes", "comprises" and/or "including", "comprising" used herein specify the presence of stated features, integers, steps, processes, members, components, and/or groups thereof, but do not preclude the presence or addition of one or more other features, integers, steps, processes, members, components, and/or groups thereof. As used herein, the term "and/or" includes any and all combinations of one or more of the associated listed items.

It will be understood that, although the terms first, second, etc. may be used herein to describe various members, components, regions, layers, and/or sections, these members, components, regions, layers, and/or sections should not be limited by these terms. These terms do not denote any order, quantity, or importance, but rather are only used to distinguish one component, region, layer, and/or section from another component, region, layer, and/or section. Thus, a first member, component, region, layer, or section discussed below could be termed a second member, component, region, layer, or section without departing from the teachings of embodiments.

Embodiments of the disclosure will be described hereinafter with reference to the drawings in which embodiments of the disclosure are schematically illustrated. In the drawings, variations from the illustrated shapes may be expected because of, for example, manufacturing techniques and/or tolerances. Thus, the embodiments of the disclosure should not be construed as being limited to the particular shapes of regions illustrated herein but may include deviations in shapes that result, for example, from manufacturing processes.

Figure 6:
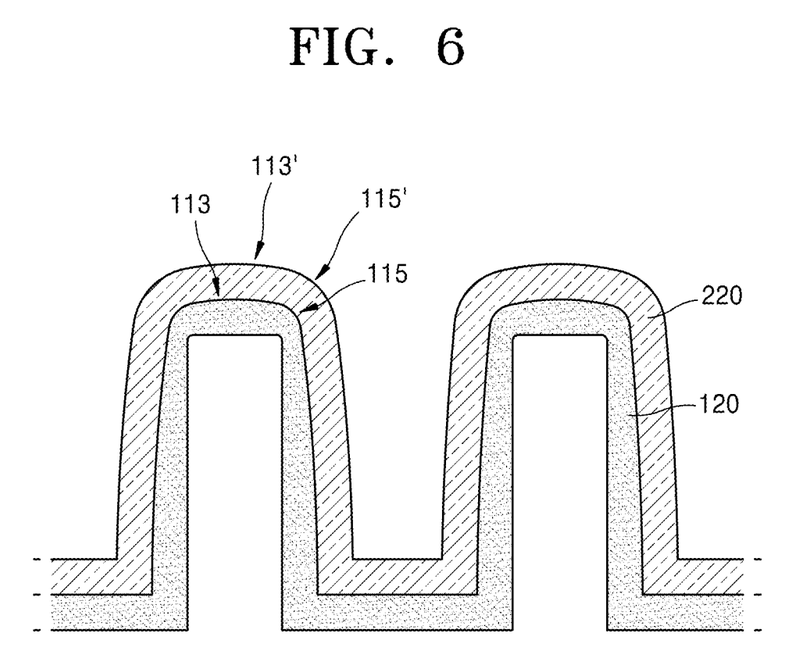
Figure 7:
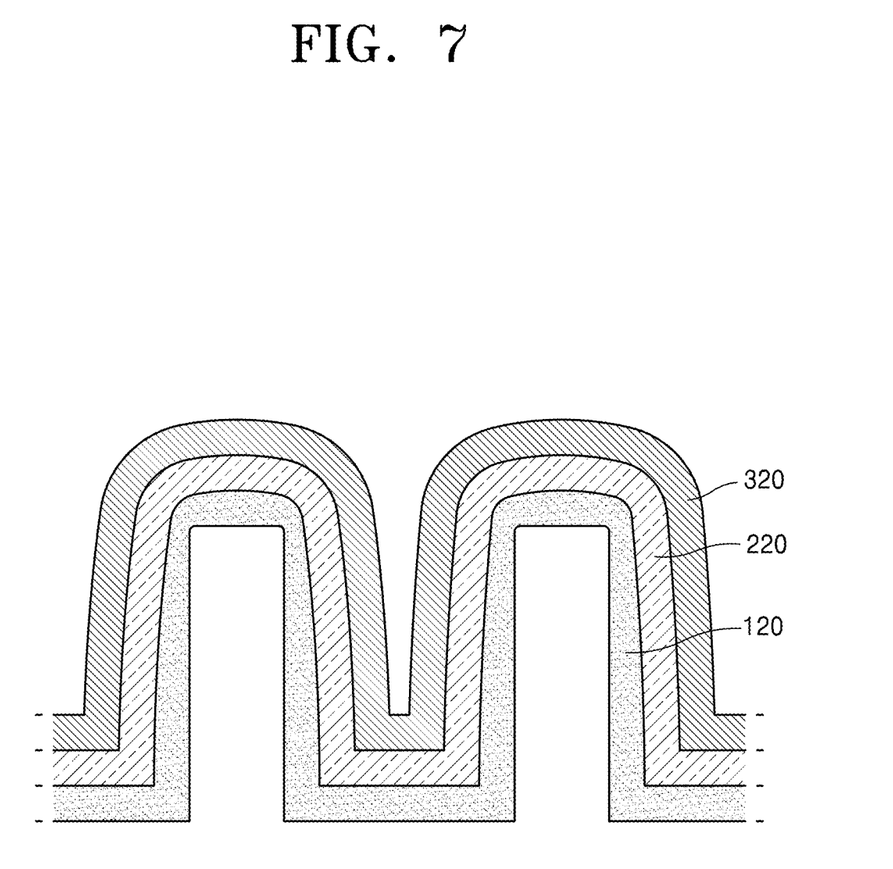
Figure 8:
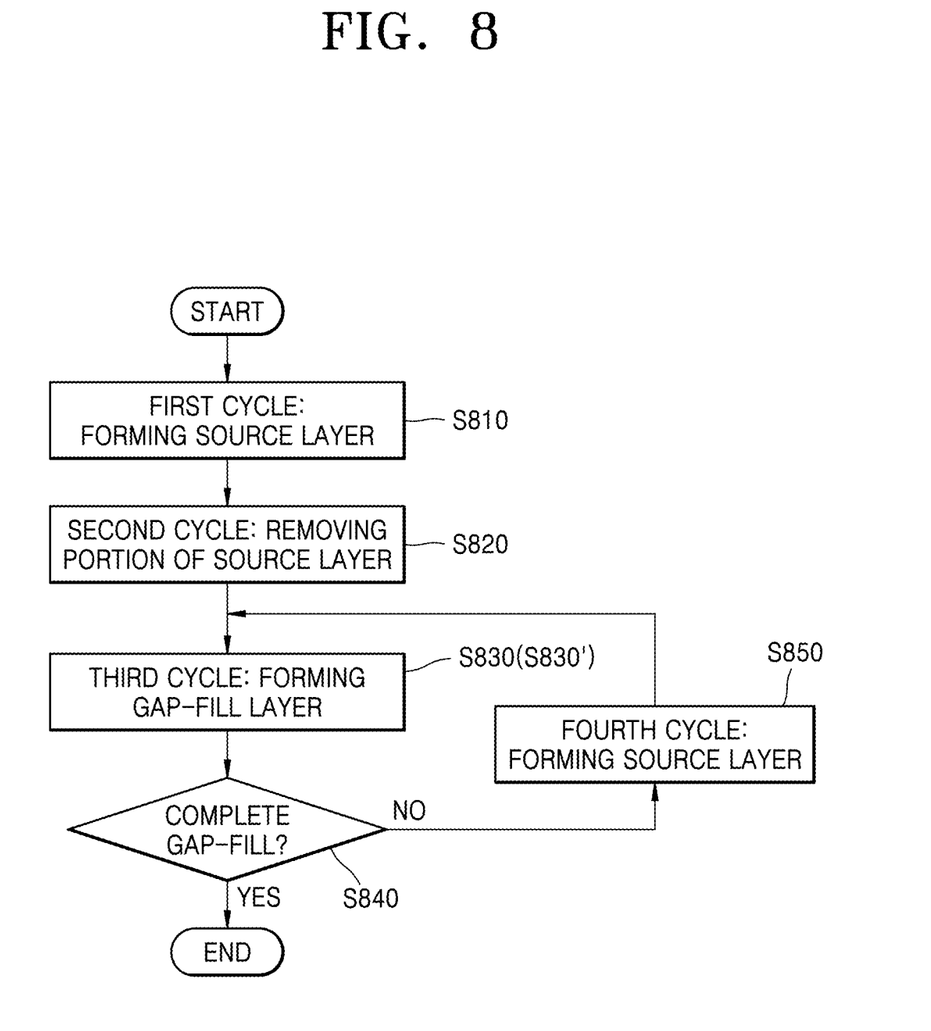
FIG. 8 is a flowchart illustrating a substrate processing method illustrated in FIGS. 1 to 7.

FIGS. 1 to 7 are views illustrating a substrate processing method according to embodiments. FIG. 8 is a flowchart illustrating a substrate processing method illustrated in FIGS. 1 and 7.

Figure 1:
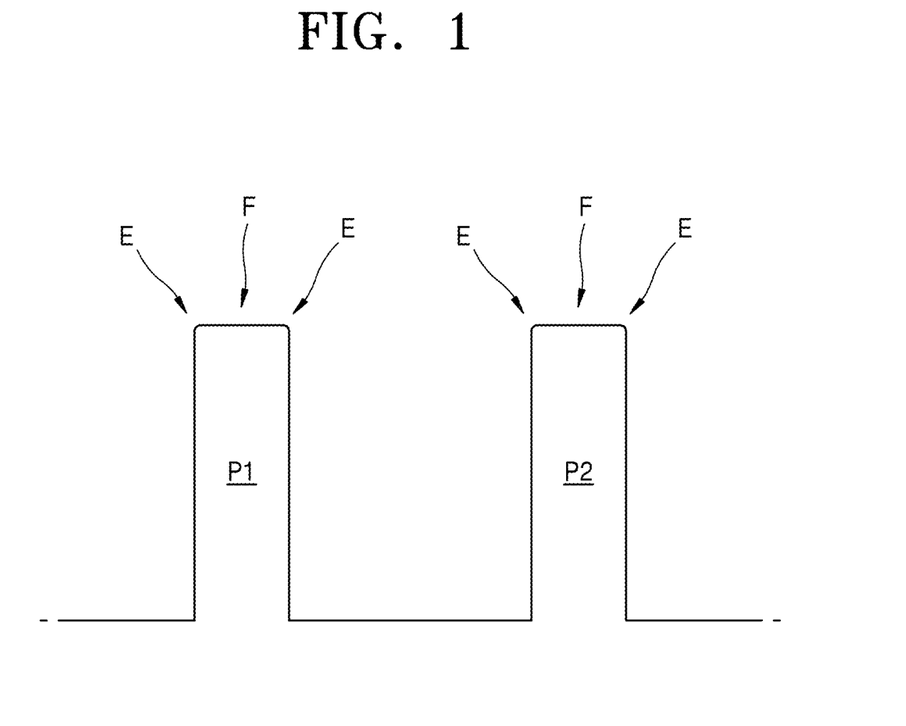
FIGS. 1 to 7 are views illustrating a substrate processing method according to embodiments.

Referring to FIG. 1, first, a pattern structure having a first protrusion P1 and a second protrusion P2 is provided. Each of upper surfaces of the first protrusion P1 and the second protrusion P2 may have a flat portion F and an edge portion E surrounding the flat portion F. In addition, the edge portion E of the first protrusion P1 and the second protrusion P2 may have a certain curvature.

The pattern structure is a non-flat structure, and may include an upper surface, a lower surface, and a side surface connecting the upper surface to the lower surface. The pattern structure may be used to form an active area or may be used to form a gate pattern. For example, when the pattern structure is used to implement a flash memory, each of the first protrusion P1 and the second protrusion P2 may include a gate electrode and a tunneling insulating layer. In another example, when the pattern structure is used to implement a metal contact, each of the first protrusion P1 and the second protrusion P2 may be an interlayer insulating layer.

The pattern structure may be formed on a substrate, and the substrate may be, for example, a semiconductor substrate or a display substrate. The substrate may include, for example, any one of silicon, silicon-on-insulator, silicon-on-sapphire, germanium, silicon-germanium, and gallium-arsenide.

Figure 2:
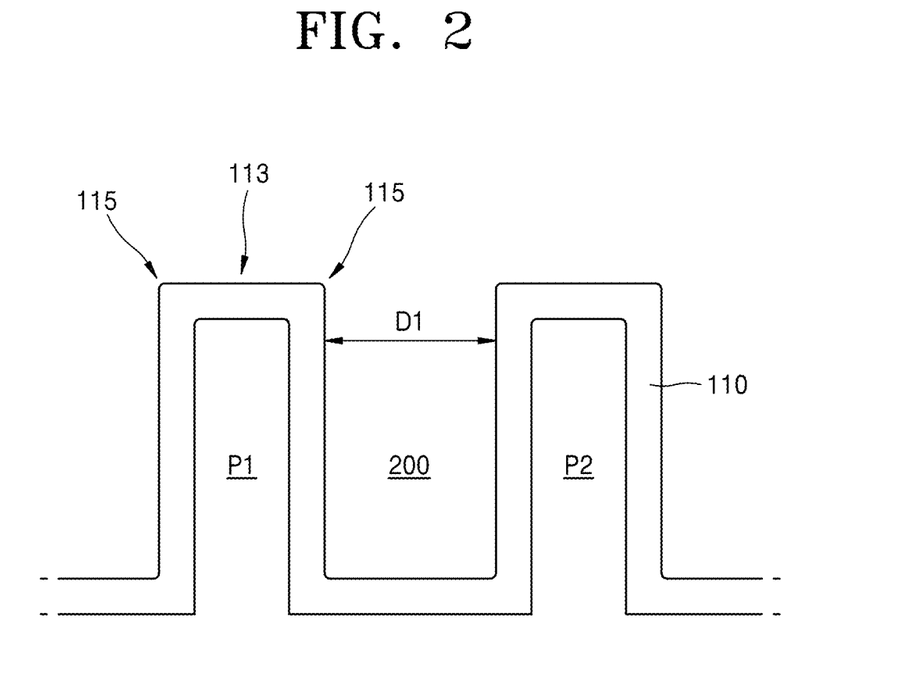

Referring to FIGS. 2 and 8, operation S810 of forming a first source layer 110 on the pattern structure is performed. To form the first source layer 110, supplying a first source gas and purging the first source gas may be performed. The supplying of the first source gas and the purging of the first source gas may be repeatedly performed.

Because the first source layer 110 is formed on the pattern structure, a recess 200 may be defined by the first source layer 110. In more detail, by forming the first source layer 110 on a side surface of the first protrusion P1, a lower surface of the pattern structure between the first protrusion P1 and the second protrusion P2, and a side surface of the second protrusion P2, the recess 200 surrounded by the first source layer 110 may be formed. The recess 200 may have an opening having a first width D1. A width of the recess may be defined, for example, as a distance between side surfaces of the opening measured at a certain height from a bottom surface of the pattern structure.

In some embodiments, the first source layer 110 may have a central portion 113 and a peripheral portion 115 surrounding the central portion 113. The peripheral portion 115 may be between an upper portion of the first source layer 110 formed on upper surfaces of the first and second protrusions P1 and P2 and a side portion of the first source layer 110 formed on side surfaces of the first and second protrusions P1 and P2. While the first source layer 110 is formed on the pattern structure, the first source layer 110 may be formed to have a peripheral portion 115 of a first curvature. That is, by forming the first source layer 110, an upper edge portion of the first source layer 110 may have a first curvature.

In some embodiments, the peripheral portion 115 of the first source layer 110 may have a first surface roughness, and the central portion 113 of the first source layer 110 may have a second surface roughness that is less than the first surface roughness. In other words, a surface roughness of the first source layer 110 on the edge portion E of the first and second protrusions P1 and P2 may be greater than a surface roughness of the first source layer 110 on the flat portion F of the first and second protrusions P1 and P2. This difference in surface roughness may be caused by structural discontinuities of the protrusions on which a thin film is formed. Due to the difference in surface roughness of the first source layer 110, the first source layer 110 may be selectively removed during a subsequent hydrogen plasma application operation.

The forming of the first source layer 110 may be performed using plasma. In more detail, the first source layer 110 may be formed by supplying the first source gas and first inert gas plasma under a first plasma atmosphere. To this end, a first inert gas may be supplied into a reaction space and a first plasma atmosphere may be formed. In another example, radicals of the first inert gas may be generated from the outside, and the radicals of the first inert gas may be supplied to the reaction space. The first source gas may be physically decomposed during the forming of the first source layer 110 by the first inert gas plasma.

For example, a silicon precursor may be used as the first source gas. In this case, the silicon precursor may be physically decomposed by the radicals of the first inert gas. Accordingly, the first source layer 110 may include an element constituting the silicon precursor. As a specific example, when an aminosilane-based silicon precursor (e.g., di-methyl divinyl silane (DMDVS)) is used as the first source gas, the first source layer 110 may include silicon, hydrogen, and carbon.

In some embodiments, helium may be used as the first inert gas, and a silicon precursor may be used as the first source gas. In this case, a helium radical may be generated by the first plasma atmosphere created during the forming of the first source layer 110, and the helium radical may physically decompose the silicon precursor. The helium radical has a less sputtering effect than other inert gas radicals (e.g., an argon radical), and thus may be suitable for thin film deposition to suppress thin film damage.

In some embodiments, by supplying the silicon precursor and the helium radical, the silicon precursor may be decomposed into a silicon element, a ligand constituting a silicon precursor molecule, element fragments, and mixtures thereof. These decomposed materials may be deposited on the pattern structure to form the first source layer 110.

According to embodiments of the inventive concept, a cycle including supplying a source gas to form a source layer and purging the source gas is repeated, and plasma is applied while supplying the source gas. This feature, in combination with a hydrogen plasma application operation described later below, may contribute to enlarging an entrance of the recess formed by the source layer by removing a portion of the edge of the source layer while allowing the source layer to have a silicon element having a relatively high fraction. In addition, it should be noted that plasma in the disclosure includes active species such as radicals and ions.

Figure 3:
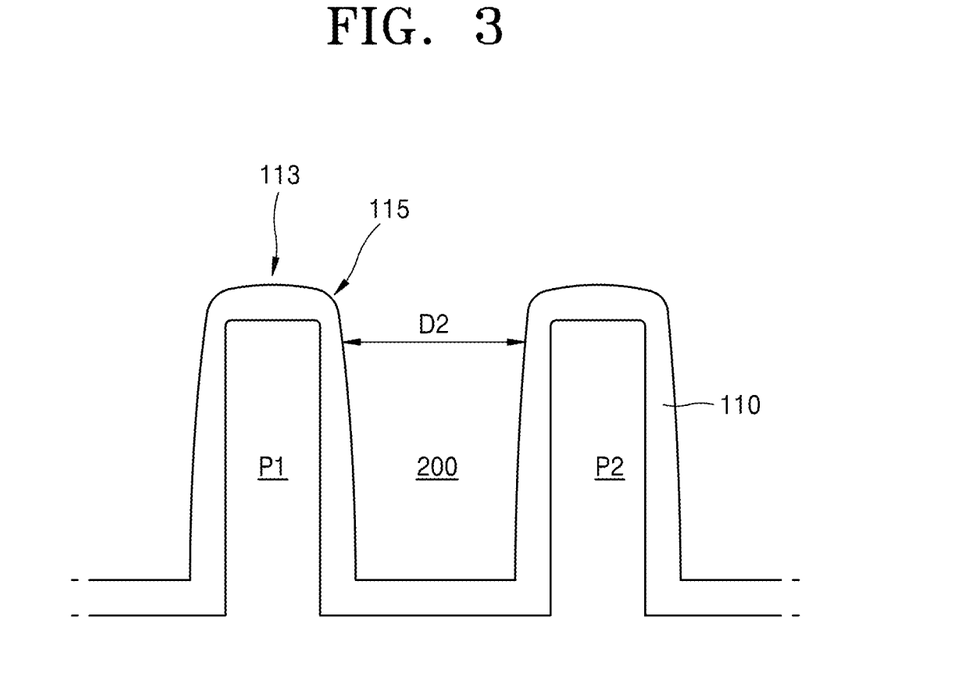

Referring to FIGS. 3 and 8, after the first source layer 110 is formed, operation S820 of removing at least a portion of the first source layer 110 by applying plasma on the first source layer 110 is performed. Thereafter, the residual radicals, ions and removed residue may be purged. The removing of at least a portion of the first source layer 110 and the purging of the residual radicals, ions and the removed residue may be repeatedly performed.

The plasma may be plasma that weakens a bonding structure of the first source layer 110. For example, when the first source layer 110 is a silicon source layer, plasma may be used to weaken a bonding structure of a Si layer by an ion bombardment effect. In another embodiment, as the plasma, plasma that does not change the physical properties of the first source layer 110 may be employed. In some embodiments, hydrogen plasma may be used as the plasma. Hereinafter, the hydrogen plasma will be described as an example.

In order to partially remove the first source layer 110, hydrogen gas may be supplied into a reaction space and a second plasma atmosphere may be formed. In another example, a hydrogen radical is generated from the outside, and the hydrogen radical may be supplied to the reaction space. The first source layer 110 may be partially removed by the hydrogen plasma.

By supplying the hydrogen radical, some of components of the first source layer 110 may be removed. For example, when the first source layer 110 is formed using a silicon precursor, components (e.g., carbon and/or hydrogen) other than silicon included in a silicon source may be volatilized by hydrogen plasma. As some of the components of the first source layer 110 are volatilized as described above, the entrance of the recess 200 surrounded by the first source layer 110 may be enlarged. That is, because the entrance of the recess 200 is enlarged, the first width D1 of the entrance may increase to a second width D2 that is greater than the first width D1.

The inventor has conceived a technical idea of using plasma capable of weakening a bonding structure of a source layer such as hydrogen plasma as a method of enlarging an opening of a recess to prevent void formation. By using this plasma to weaken the bonding structure of the source layer, a technical effect may be achieved in that a source layer on an edge portion of a protrusion is removed more than a source layer on a flat portion of the protrusion.

This technical effect may be achieved based on various causes. For example, during operation S820 of removing at least a portion of the first source layer 110, the plasma intensity at the edge portion E of the first and second protrusions P1 and P2 may be greater than the plasma intensity at the flat portion F of the first and second protrusions P1 and P2. Because an electric field is more likely to be concentrated on the edge portion E than on the flat portion F, a difference in plasma intensity may occur. Due to the difference in plasma intensity, the degree of removal of the first source layer 110 on the edge portion E may be greater than that of the first source layer 110 on the flat portion F.

As another cause, a difference in etch rate for each location may occur due to a difference in the number of collisions of plasma radicals and/or ions. In more detail, while supplying plasma, the number of collisions of the plasma radicals and/or ions with the first source layer 110 on the edge portion E may be greater than the number of collisions of the plasma radicals and/or ions with the first source layer 110 on the flat portion F. This is because the surface of the first source layer 110 on the flat portion F extends in one direction (i.e., horizontally) while the surface of the first source layer 110 (i.e., the peripheral portion 115 of the first source layer 110) on the edge portion E extends in two directions (i.e., horizontally and vertically).

As another cause, a difference in surface roughness for each location of the first source layer 110 may be considered. As described above, the first surface roughness of the first source layer 110 on the edge portion E may be greater than the second surface roughness of the first source layer 110 on the flat portion F. Accordingly, the number of collisions of plasma radicals and/or ions with the peripheral portion 115 of the first source layer 110 having a relatively large first surface roughness may be greater than the number of collisions of plasma radicals and/or ions with the central portion 113 of the first source layer 110 having a relatively less second surface roughness (see FIG. 14). Due to the difference in the number of collisions of plasma radicals and/or ions, the degree of removal may be different for each location.

Because the degree of removal of the peripheral portion 115 of the first source layer 110 is greater than the degree of removal of the central portion 113 of the first source layer 110, a first curvature of the peripheral portion 115 of the first source layer 110 may increase. That is, by removing at least a portion of the first source layer 110 described above, the peripheral portion 115 of the first source layer 110 may have a second curvature that is greater than the first curvature.

Figure 4:
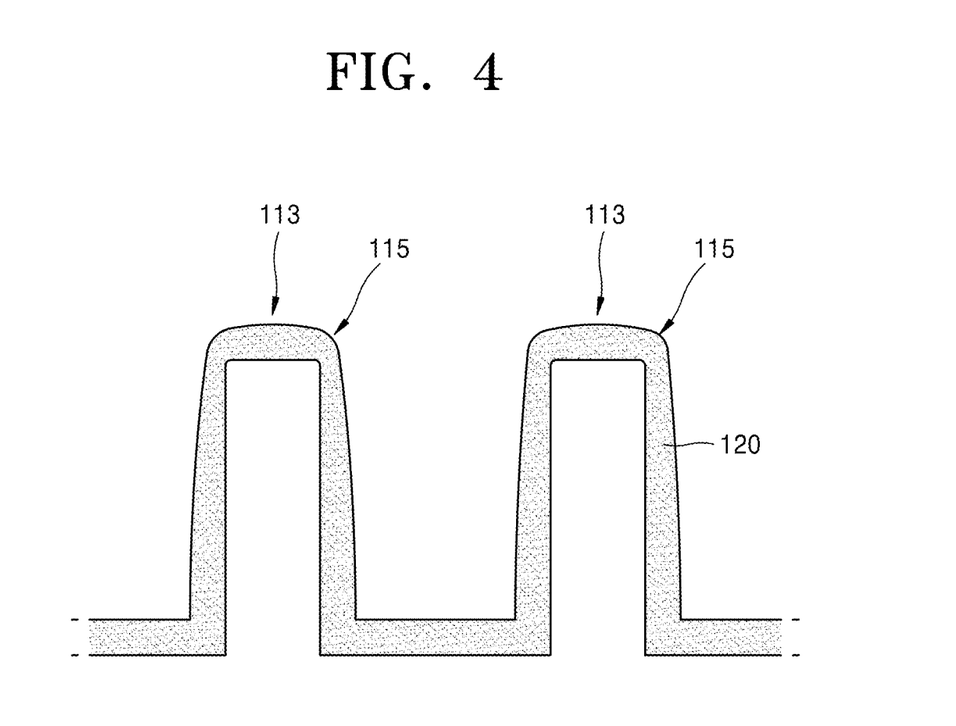

Referring to FIGS. 4 and 8, a first gap-fill layer 120 is formed by supplying a first reactant gas on the first source layer 110. As a specific example, in a state in which at least a portion of the first source layer has been removed (see FIG. 3), the first gap-fill layer 120 may be formed by changing the chemical properties of the first source layer. In order to form the first gap-fill layer 120, supplying a first reactant gas and purging a first reactant gas may be performed. The supplying of the first reactant gas and the purging of the first reactant gas may be repeatedly performed.

The forming of the first gap-fill layer 120 may be performed using plasma. In more detail, the first gap-fill layer 120 may be formed by supplying the first reactant gas under a third plasma atmosphere. For example, when the first source layer 110 is a silicon source layer and the first reactant gas is nitrogen, silicon nitride may be formed by reacting the silicon source layer with nitrogen plasma.

By forming the first gap-fill layer 120 as described above, a gap, which is a space between the first protrusion P1 and the second protrusion P2, may be partially filled. Because only one gap-fill layer is currently formed and the gap-fill is not completed, additional layers are continuously formed after operation S840 of determining whether the gap-fill is completed.

Figure 5:
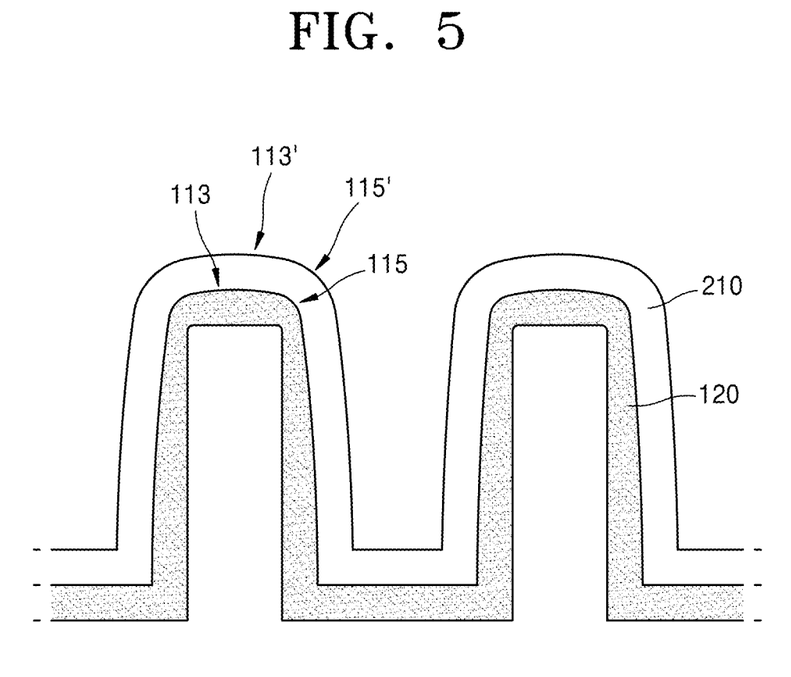

Referring to FIGS. 5 and 8, operation S850 of forming a second source layer 210 on the first gap-fill layer 120 is performed. To form the second source layer 210, supplying a second source gas and purging the second source gas may be performed. The supplying of the second source gas and the purging of the second source gas may be repeatedly performed.

The forming of the second source layer 210 may be performed using plasma. In more detail, the second source layer 210 may be formed by supplying the second source gas and second inert gas plasma under a fourth plasma atmosphere. In some embodiments, the second inert gas plasma may be different from the first inert gas plasma used during the forming of the first source layer 110.

In some embodiments, the first inert gas plasma may be a helium radical, and the second inert gas plasma may be an argon radical. As described above, the helium radical is suitable for thin film deposition that inhibits thin film damage, whereas the argon radical may be the opposite. By supplying argon plasma having a relatively strong sputtering effect while forming the second source layer 210, an additional entrance expansion effect of the recess 200 (not shown in FIG. 5) may be achieved.

Thereafter, referring to FIGS. 6 and 8, operation S830' of forming a second gap-fill layer 220 by supplying a second reactant gas onto the second source layer 210 is performed. Operation S830' of forming the second gap-fill layer 220 may be performed under the same process conditions as those of operation S830 of forming the first gap-fill layer 120. In order to form the second gap-fill layer 220, supplying a second reactant gas and purging a second reactant gas may be performed.

Thereafter, operation S840 of determining whether gap-fill is completed is performed, and when the gap-fill is not completed, operations S850 and S830 are repeated. FIG. 7 shows a state in which a third gap-fill layer 320 is formed by repeating these operations.

In this way, according to embodiments, in performing a gap-fill process, by varying the etching degree of a central portion and an edge portion of an upper surface of a gap where a thin film is deposited, the edge portion may be selectively removed. By this selective removal, the width of an upper area of the gap may be kept wider than the width of a lower area of the gap, so that bottom-up filling is possible and a gap-fill process without voids or seams may be more easily achieved.

Figure 9:
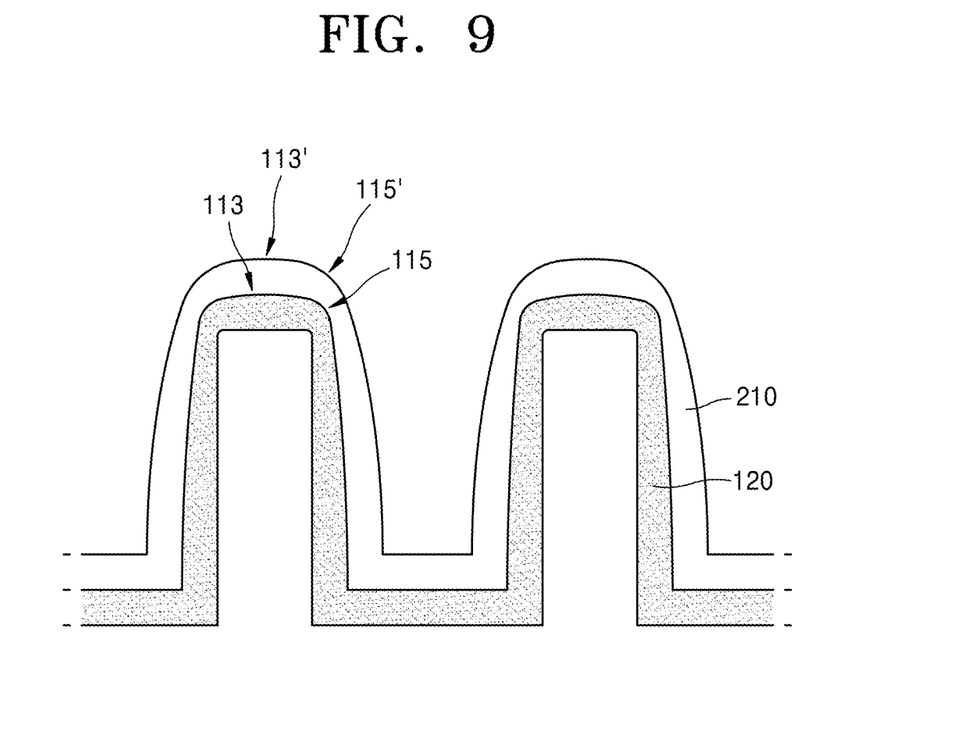
FIGS. 9 and 10 are views illustrating a substrate processing method according to embodiments.
Figure 10:
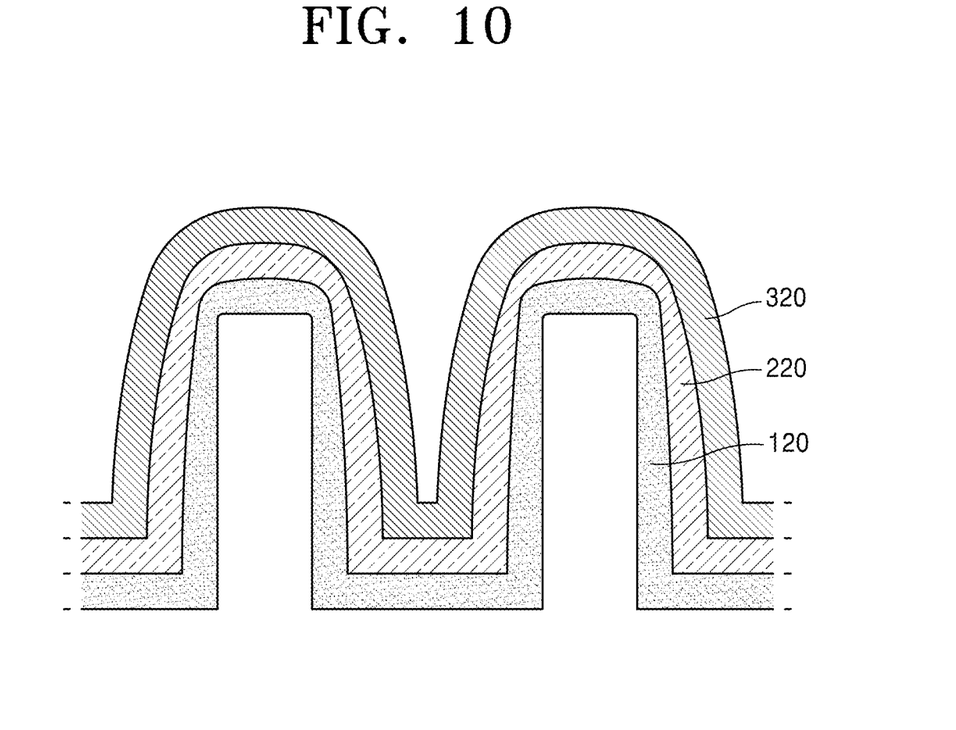
Figure 11:
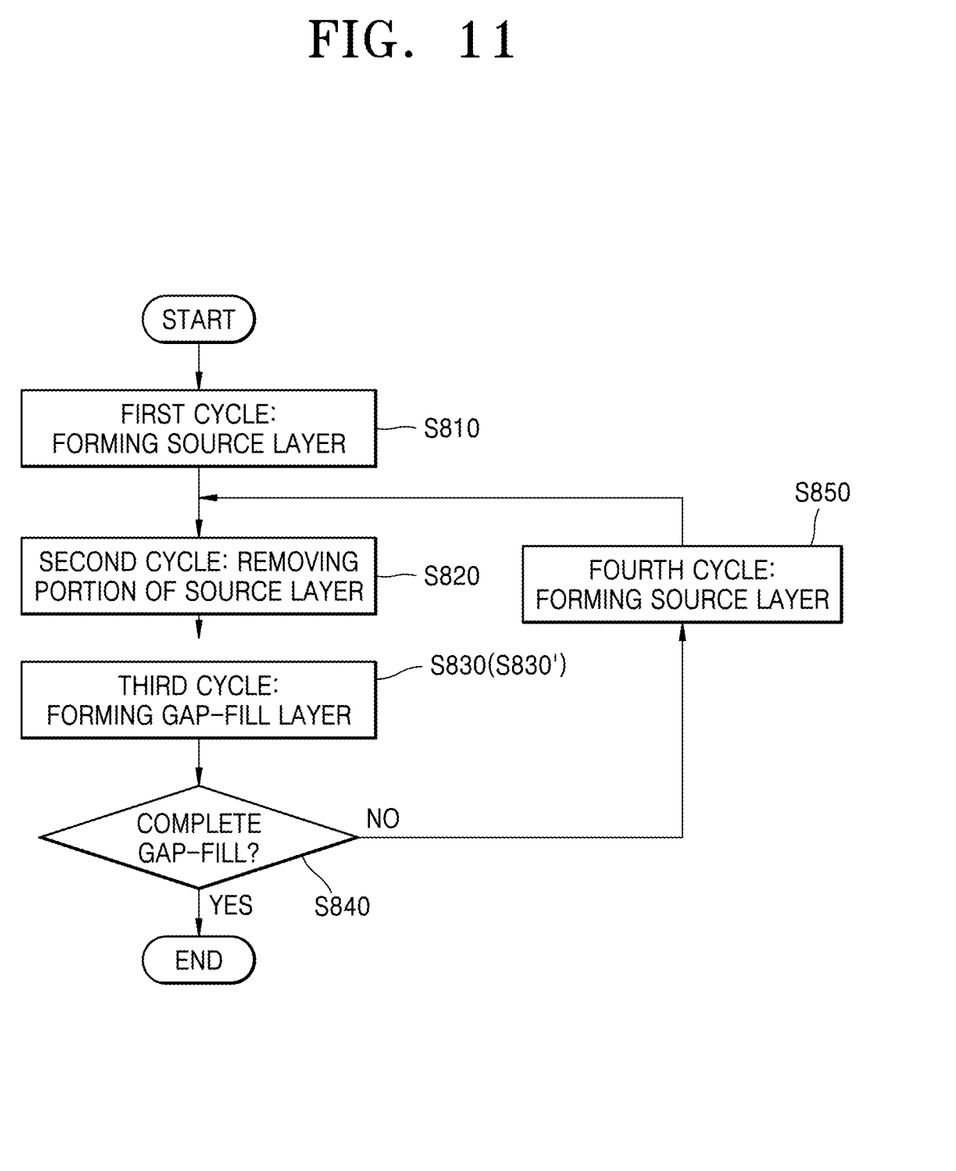
FIG. 11 is a flowchart illustrating a substrate processing method illustrated in FIGS. 9 and 10.

FIGS. 9 and 10 are views illustrating a substrate processing method according to embodiments. FIG. 11 is a flowchart illustrating a substrate processing method illustrated in FIGS. 9 and 10. The substrate processing method according to the embodiments may be a variation of the substrate processing method according to the above-described embodiments.

Referring to FIG. 11, a first cycle (operation S810) including forming a first source layer, a second cycle (operation S820) including removing a portion of the first source layer, a third cycle (operation S830) including forming a first gap-fill layer, and a fourth cycle (operation S850) including forming a second source layer are performed. Because the operations are the same as operations S810, S820, S830, S840, and S850 in FIG. 8 described above, repeated descriptions of the operations will not be given herein.

Referring to FIGS. 9 and 11, after the fourth cycle (operation S850) is performed, the second cycle (operation S820) is performed. That is, after the second source layer 210 is formed, at least a portion of the second source layer 210 is removed by supplying hydrogen plasma on the second source layer 210.

As at least a portion of the second source layer 210 is removed, the curvature of a peripheral portion 115' of the second source layer 210 becomes greater than the curvature of the peripheral portion 115 of the first source layer 110 (and the first gap-fill layer 120). This is in contrast to the embodiments of FIGS. 1 to 8 in which the curvature of the peripheral portion 115' of the second source layer 210 is the same as the curvature of the peripheral portion 115 of the first source layer 110 (and the first gap-fill layer 120).

Referring to FIGS. 10 and 11, after the second cycle (operation S820), the third cycle (operation S830') is performed to form the second gap-fill layer 220. Because the second gap-fill layer 220 is formed based on the second source layer 210 having the peripheral portion 115' with an increased curvature, an entrance of a recess formed by the second gap-fill layer 220 may be enlarged. Accordingly, the generation of voids may be further suppressed during the subsequent formation of the third gap-fill layer 320. That is, according to the embodiments according to FIGS. 9 to 11, when forming a second gap-fill layer to an $N^{th}$ gap-fill layer, by applying hydrogen plasma to selectively remove a portion of a second source layer or an $N^{th}$ source layer at the edge of a pattern structure after forming the second source layer or the N-th source layer, there is a technical effect of performing a gap-fill process while keeping the width of an upper portion of the recess wider than that of a lower portion of the recess portion.

As such, according to embodiments, between the forming of the second source layer 210 and the forming of the second gap-fill layer 220, removing at least a portion of the second source layer 210 by supplying hydrogen plasma on the second source layer 210 may be additionally performed, and through this, a gap-fill process without voids may be more easily achieved.

Although the above-described embodiments have been described on the premise that a source layer is formed and then a reactant gas is supplied to the source layer to form a gap-fill layer, the disclosure is not limited thereto. For example, in the disclosure, a gap-fill process may be performed using a source layer. That is, the gap-fill process may be performed through repetition of the first cycle of forming a source layer and the second cycle of removing a portion of the source layer without supplying a reactant gas. In this case, the source layer will consist only of constituent elements of a source gas supplied to form the source layer.

Figure 12:
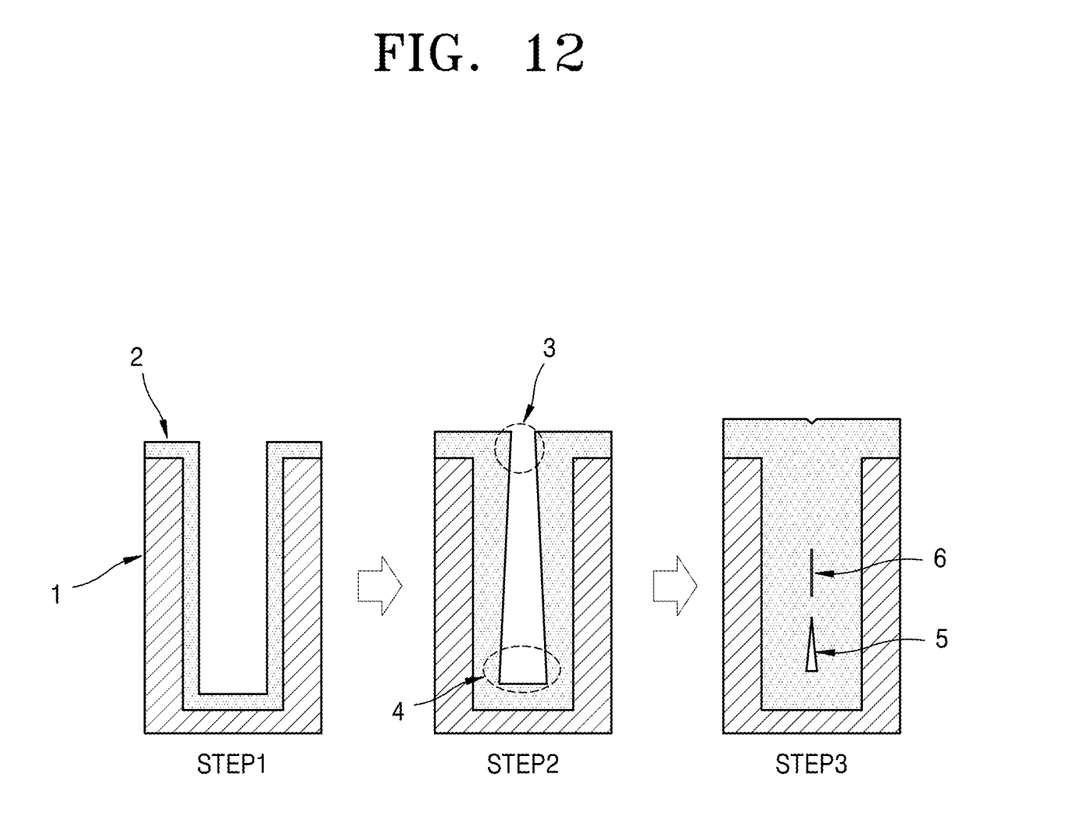
FIG. 12 is a view illustrating a gap-filling process using an atomic layer deposition process.

FIG. 12 is a view illustrating a conventional gap-filling process using an atomic layer deposition process.

In FIG. 12, while atomic layer deposition is performed in a recess area (gap) of a pattern structure 1, the gap is filled. According to an atomic layer deposition method, a plurality of different reactant gases are alternately supplied to fill the gap and this process is repeated (STEP 1). However, when the supply and purge time of a reactant gas is shortened for reasons such as productivity improvement, a process of reaching to a lower area 4 of the gap and discharging the reactant gas from a lower area 4 of the gap is not smooth compared to an upper area 3 of the gap. As a result, as shown in STEP 2, a relatively large amount of deposition is made in the upper area 3 of the gap and an entrance of the gap, and relatively less deposition is made in the lower area 4 of the gap. When the processes (STEP1 and STEP2) are further repeated, as shown in STEP 3, the upper area of the gap is closed first, and a void 5 or a seam 6 remains at the lower area of the gap.

Figure 13:
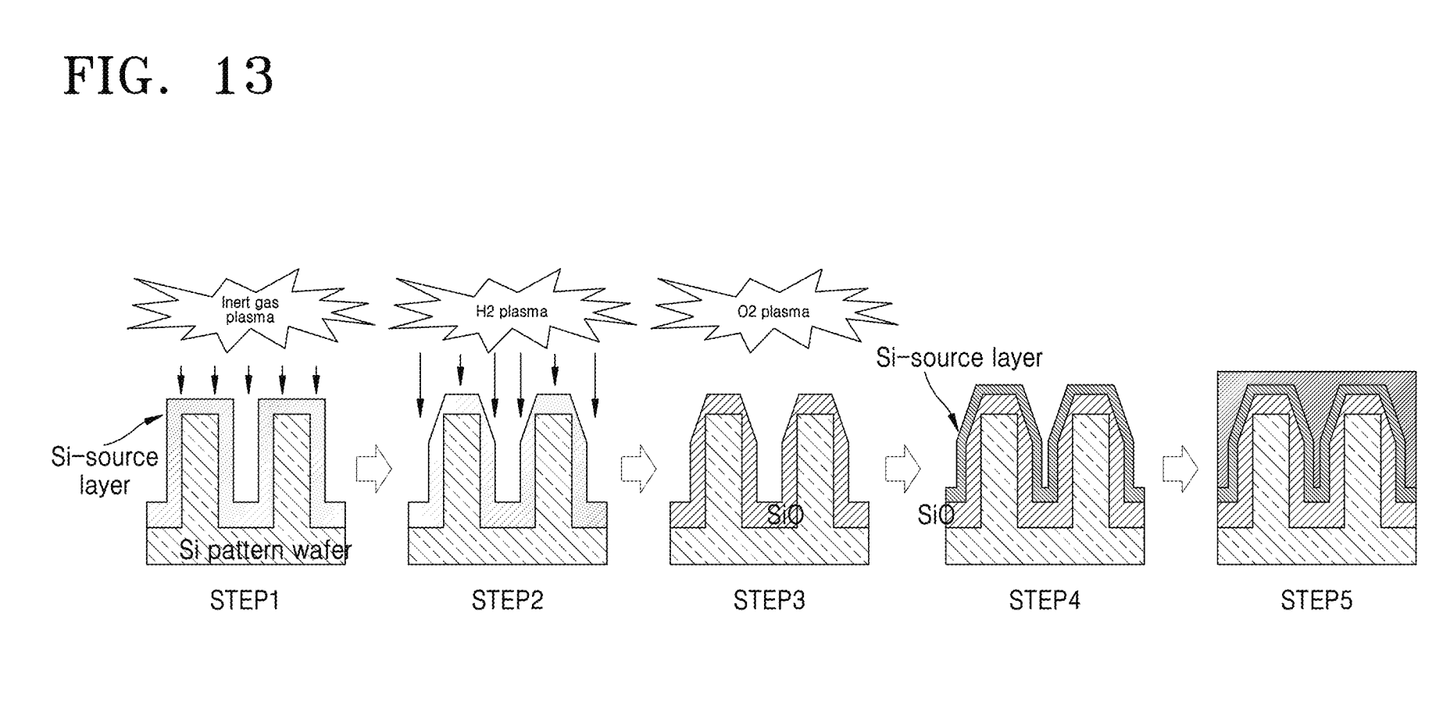
FIG. 13 is a view illustrating a gap-filling process according to an embodiment.

FIG. 13 shows a gap-filling process according to an embodiment.

FIG. 13 illustrates filling a gap while depositing a $SiO_2$ layer on a pattern structure including a recess area by a plasma atomic layer deposition method. The process of each step is as follows.

First step (STEP 1): Forming a Si layer on the pattern structure. The Si layer is uniformly formed on the pattern structure by supplying a Si precursor and inert gas plasma on the pattern structure including the recess area. He is used as an inert gas. He has a less sputtering effect than Ar, so that the decrease in thin film uniformity and damage to a thin film are more suppressed compared to Ar plasma. A He inert gas radical does not react with the Si precursor, but physically decomposes the Si precursor through an ion bombardment effect. Therefore, the Si layer may be composed of a Si element, a ligand constituting a Si precursor molecule, element fragments, or mixtures thereof. For example, in the case of an aminosilane-based Si precursor, the film on the pattern structure may be Si, H, C, or mixtures thereof. This step is repeated at least once.

Figure 14:
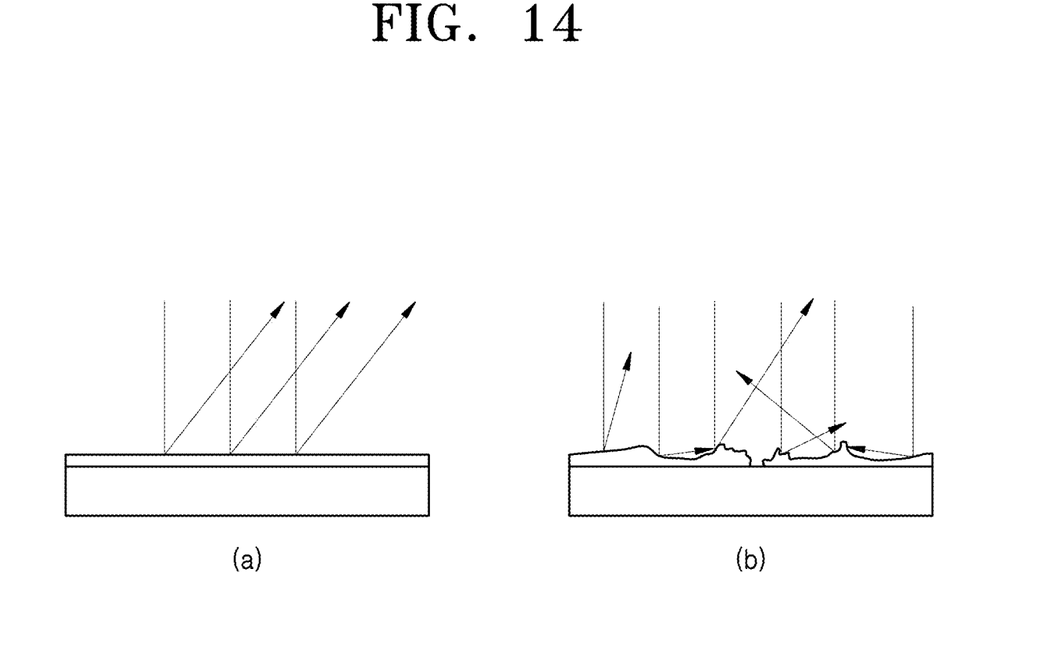
FIG. 14 is a schematic view illustrating an effect of regular reflection in the plane and irregular reflection in the corner.

Second step (STEP 2): Hydrogen (H2) plasma etch. In this step, hydrogen plasma is supplied. By generating hydrogen plasma, a bonding structure of the Si layer on the pattern structure in a direction perpendicular to the direction of a hydrogen radical is weakened by the ion bombardment effect. In particular, in this step, the plasma intensity applied to a corner portion of an upper flat portion of the pattern structure is greater than that applied to a flat portion of the pattern structure, which further weakens the bonding structure of the Si layer deposited on the edge of the pattern structure. Accordingly, an etch rate of the edge portion of the pattern structure is higher than that of the upper flat portion of the pattern structure. As can be seen from FIG. 13, this process has a technical effect of widening an entrance of a gap structure in the second step. In other words, by increasing the intensity of radicals at the edge of a flat portion in a direction perpendicular to the direction of the hydrogen radical, the etch rate of the edge portion may be further increased and selective etching is possible. In general, because the edge portion is an area where surfaces facing different directions intersect and the discontinuity of a thin film is greater than in the flat portion, the bonding degree of the thin film is less than that in the flat portion, and the edge portion is more susceptible to ion bombardment of radicals, resulting in a high etching rate. In addition, due to the low continuity of the thin film, the surface roughness is greater and the diffused reflection of radicals is increased, which further weakens the thin film structure by applying additional secondary and tertiary impacts to the adjacent portions of the thin film (FIG. 14(b)).

FIG. 14 is a schematic view illustrating an effect of regular reflection in the plane (FIG. 14(a)) and irregular reflection in the corner (FIG. 14(b)). In the second step of FIG. 13, the hydrogen radical also reacts with constituents in the thin film, such as hydrogen or carbon, or mixtures thereof to be volatilized in a gaseous state. Therefore, the hydrogen radical also increases the relative fraction of a silicon element in the thin film. This step is repeated at least once to enlarge the entrance of a gap structure. Also, as the entrance of the gap structure is enlarged, it becomes easier to supply the Si precursor to a bottom surface of the gap structure.

Step 3 (STEP 3): Forming a $SiO_2$ layer. In this step, the $SiO_2$ layer is formed by chemically bonding with the Si layer on a substrate by supplying oxygen radicals. Because the entrance portion of the gap structure has already been enlarged in the second step, it becomes easier for the oxygen radicals to reach the bottom of the gap, and bottom-up fill proceeds from the lower area of the gap to the upper area of the gap. This step is repeated at least once.

Fourth step (STEP 4): Forming a Si layer. In this step, the Si layer is formed on the $SiO_2$ layer formed in the third step. In the same manner as in the first step, a film containing Si is formed while supplying the inert gas plasma. Thereafter, the $SiO_2$ layer is formed while supplying oxygen plasma. That is, the third and fourth steps are repeated a plurality of times. However, when the width of an upper portion of the gap becomes narrower than that of a lower portion of the gap, the second step may be selectively added, and the bottom-up fill may be continued while maintaining the width of the upper portion of the gap to be wider than that of the lower portion of the gap.

Fifth step (STEP 5): Filling the gap. In this step, the bottom-up fill of the gap is performed by repeating the first to fourth steps to fill the gap without voids, cracks, and seams.

According to the disclosure, there is a technical effect that, in performing the gap-fill process, by varying etch rates of a central portion and an edge portion of an upper surface of a pattern structure on which a thin film is deposited, selective etching of the edge portion is facilitated, and bottom-up fill is possible and the gap-fill process without voids or seams becomes easier by keeping the width of the upper area of the gap wider than that of the lower area.

FIG. 13 shows the filling of the gap with the $SiO_2$ layer as an example, but a method of filling the gap with a SiN layer is also applicable. That is, a SiN gap-fill process is also possible by supplying nitrogen plasma instead of oxygen plasma in the third step of FIG. 13. Alternatively, a SiON gap-fill process is also possible by supplying oxygen plasma and nitrogen plasma simultaneously or sequentially. Alternatively, a Si or SiC gap-fill process is also possible by repeating the first and second steps without performing the third and fourth steps.

Figure 15:
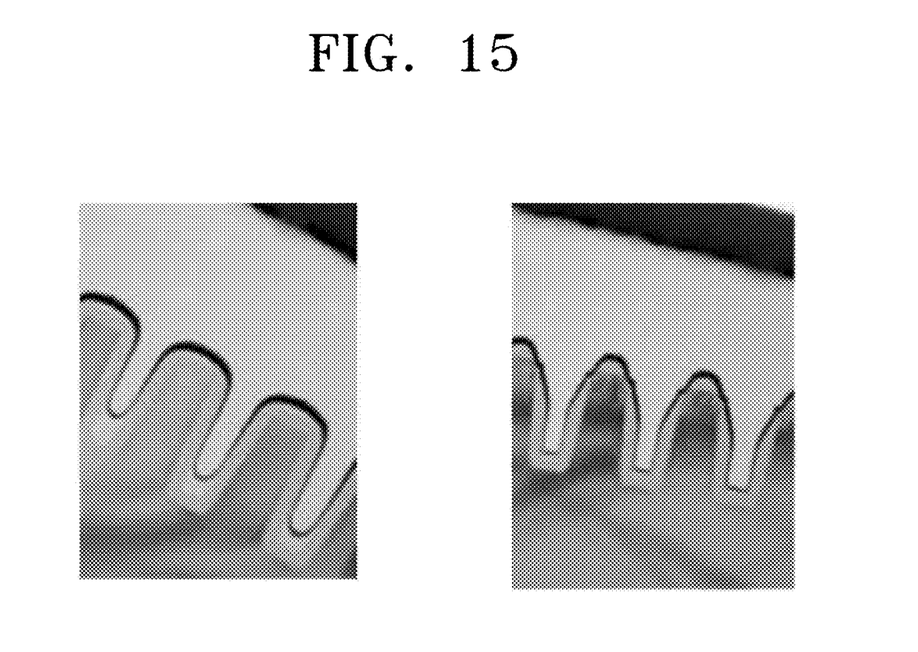
FIG. 15 is a view illustrating the etching degree at an entrance area of a gap when hydrogen plasma etching is performed after forming a Si layer.

FIG. 15 shows the etching degree at an entrance area of a gap when hydrogen plasma etching is performed (second step) after forming the Si layer (first step).

As can be seen in FIG. 15, through the hydrogen plasma etching according to the disclosure, an edge portion in an upper area of a pattern structure in which a Si-containing film is formed is etched, and the width of the entrance of the gap is widened.

Table 1 shows characteristics of a film after performing a SiO, SiN, or SiC gap-fill process according to the disclosure. For example, the $SiO_2$ gap-fill is performed by supplying oxygen plasma in the third step of FIG. 13, and the SiN gap-fill is performed by supplying nitrogen plasma in the third step of FIG. 13. The SiC gap-fill is performed by repeating a Si precursor supply operation (first step) and an $H_2$ plasma etching operation (second step) without supplying oxygen or nitrogen plasma. Characteristics of a film are measured by comparing the refractive index (RI) of a deposited film with a reference value (normal RI).

TABLE 1

| @633 nm | Reference RI | Experimental results RI |
|---|---|---|
| SiC | 2.5 | 2.1 |
| SiN | 1.9 | 1.7 |
| SiO | 1.5 | 1.4 |

In Table 1 above, when light having a wavelength of about 633 nm is irradiated to each film, it can be seen that the refractive index of each film is close to the reference value and that a gap-fill process with a target film quality has been performed.

Figure 16:
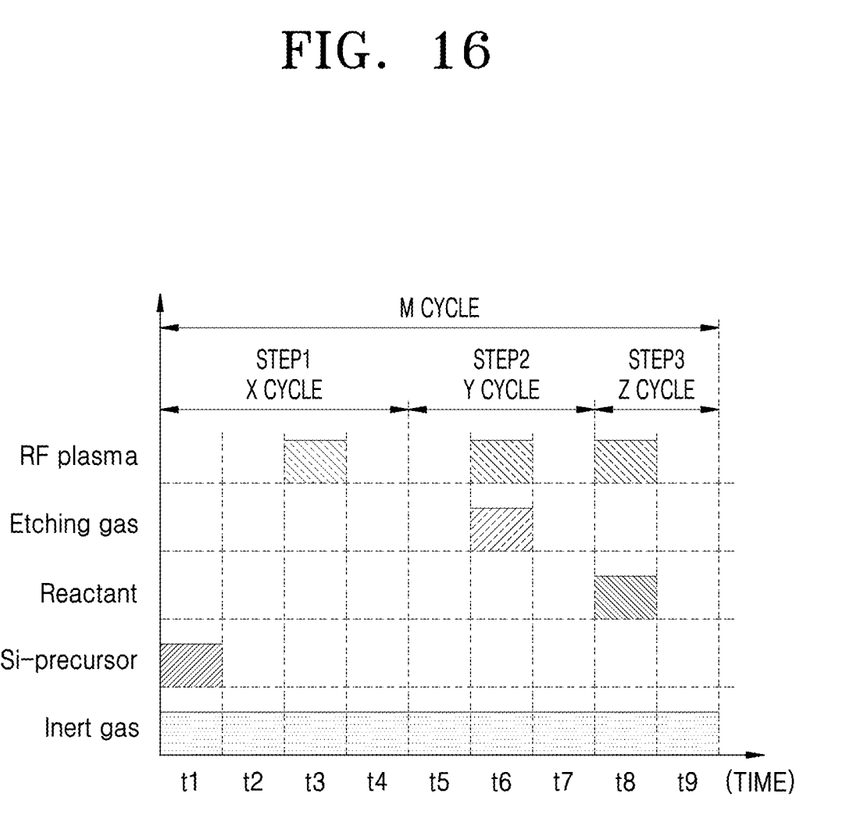
FIG. 16 is a view illustrating the process of FIG. 13.

FIG. 16 shows the process of FIG. 13 according to the disclosure.

In FIG. 16, a first step (STEP 1), a second step (STEP 2), and a third step (STEP 3) correspond to the first step (STEP 1), the second step (STEP 2), and the third step (STEP 3) of FIG. 13, respectively. That is, in the first step, a Si-containing film is uniformly formed on a pattern structure including a recess. In step t3 of the first step, as an inert gas is activated by RF power, a Si precursor is decomposed, and a Si element and precursor constituent element fragments form a physical bonding on a substrate surface to form a film composed of mixtures of several elements, and the film is physically densified by an ion bombardment effect of radical ions. In the second step, a hydrogen etching gas is activated by the RF power and the edge of an upper surface of the pattern structure is etched (See FIG. 4). In the third step, the Si-containing film is converted into a $SiO_2$ or SiN layer while supplying an oxygen or nitrogen reactant gas. Each step is repeated at least once (X, Y, and Z cycles) according to a sub-cycle, and again at least once (M cycles) according to a super-cycle. The inert gas serves as a carrier gas when supplying the Si precursor, and serves as a purge gas to remove a residual gas in a gas supply line and a reactor in the purge step.

TABLE 2

| Process parameter | Detailed conditions | |
|---|---|---|
| Process temperature (° C.) | 100° C. to 300° C. | |
| Process pressure (Torr) | 1.0 Torr to 9.0 Torr | |
| Si precursor | Di-methyl divinyl silane (DMDVS) | |
| Gas flow rate (sccm) | Source carrier gas (He) | 100 sccm to 6,000 sccm |
| | Source purge gas (He) | 100 sccm to 6,000 sccm |
| | Etching gas ($H_2$) | 10 sccm to 1,000 sccm |
| | Reactant ($O_2$ or $N_2$) | 100 sccm to 6,000 sccm |
| Step 1 process time (sec) | Source supply (t1) | 0.05 to 3.0 |
| | Source purge (t2) | 0.05 to 3.0 |
| | Plasma on (t3) | 0.05 to 3.0 |
| | Purge (t4) | 0.05 to 3.0 |
| Step 2 process time (sec) | Purge (t5) | 0.05 to 3.0 |
| | H2/plasma-on (t6) | 0.05 to 3.0 |
| | Purge (t7) | 0.05 to 3.0 |

TABLE 2-continued

| Process parameter | Detailed conditions | |
| --- | --- | --- |
| Step 3 process time (sec) | O₂ or N₂/ plasma-on (t8) | 0.05 to 3.0 |
| | Purge (t9) | 0.05 to 3.0 |
| Plasma conditions | RF frequency (MHz) | 13.56 MHz |
| | RF power (W) | 50 W to 2,000 W |

Table 2 above shows process conditions of a gap-fill process using a SiO₂ layer or a SiN layer according to FIG. 6. In the case of a SiO₂ process, an oxygen-containing gas is supplied as a reactant gas, and in the case of a SiN process, a nitrogen-containing gas is supplied as a reactant gas. In Table 2, an oxygen (O₂) gas or a nitrogen (N₂) gas is supplied.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope of the disclosure as defined by the following claims.

What is claimed is:

1. A substrate processing method comprising:
providing a pattern structure having a first protrusion and a second protrusion, wherein each of the first protrusion and the second protrusion comprise an upper surface and a side surface;
forming a first layer, wherein forming the first layer comprises:
forming a first source layer on the pattern structure, wherein the first source layer comprises a central portion disposed above the upper surface, a side portion disposed laterally from the side surface, and a peripheral portion disposed between the central portion and the side portion, wherein each of upper surfaces of the first protrusion and the second protrusion has a flat portion on the upper surface and an edge portion surrounding the flat portion, wherein forming the first source layer comprises:
supplying a first source gas and a first inert gas,
stopping the supply of the first source gas and continuing supply of the first inert gas;
after stopping supply of the first source gas, forming a first inert gas plasma from a gas consisting of the first inert gas,
after the step of forming the first source layer, forming a hydrogen plasma comprising hydrogen radicals and supplying the hydrogen plasma on the first source layer to remove at least a portion of the first source layer by the hydrogen radicals, wherein the peripheral portion of the first source layer is removed more than the central portion of the first source layer,
after the step of forming and supplying the hydrogen plasma, purging the residual radicals, ions, and removed residue, and
after purging, supplying a first reactant gas consisting of nitrogen,
forming a third plasma from a gas consisting of the first inert gas and the first reactant gas,
wherein, during the removing of at least a portion of the first source layer, the plasma intensity at the edge portion is greater than the plasma intensity at the flat portion, which further weakens the bonding structure of the first source layer deposited on the edge portion of the pattern structure, resulting in an etch rate of the edge portion of the pattern structure is higher than that of the flat portion of the pattern structure.

2. The substrate processing method of claim 1, wherein the first source gas comprises a silicon precursor.

3. The substrate processing method of claim 2, wherein
the silicon precursor comprises an aminosilane-based silicon precursor, and
the first source layer comprises silicon, hydrogen, and carbon.

4. The substrate processing method of claim 3, wherein di-methyl divinyl silane (DMDVS) is used as the silicon precursor.

5. The substrate processing method of claim 2, wherein the first inert gas plasma comprises a helium radical, and the helium radical physically decomposes the silicon precursor.

6. The substrate processing method of claim 1, further comprising:
after forming the third plasma, repeating the steps of forming the first inert gas plasma and forming the third plasma a plurality of times.

7. The substrate processing method of claim 1, further comprising: after forming the third plasma, repeating the steps of forming the first inert gas plasma, forming the hydrogen plasma, and forming the third plasma a plurality of times.

8. The substrate processing method of claim 1, wherein a surface roughness of the peripheral portion of the first source layer is greater than a surface roughness of the central portion of the first source layer.

9. The substrate processing method of claim 1, wherein
a recess surrounded by the first source layer is formed by the forming of the first source layer,
an entrance of the recess is enlarged by the removing of at least a portion of the first source layer, and
the entrance of the recess is wider than the portions of the recess below the entrance.

10. The substrate processing method of claim 1, wherein
the peripheral portion of the first source layer has a first curvature by the forming of the first source layer, and
the peripheral portion of the first source layer has a second curvature that is greater than the first curvature by the removing of at least a portion of the first source layer.

11. The substrate processing method of claim 1, wherein supplying the first reactant gas and the third plasma forms the first layer by changing the chemical properties of the first source layer, wherein the first layer comprises silicon nitride.

12. The substrate processing method of claim 11, further comprising forming a second source layer by supplying a second source gas and second inert gas plasma on the first layer, wherein the second inert gas plasma is an argon plasma and the first inert gas plasma is a helium plasma.

13. The substrate processing method of claim 12, comprising repeating the steps of supplying a first source gas and a first inert gas, stopping the supply of the first source gas and continuing supply of the first inert gas, forming a first inert gas plasma, forming a hydrogen plasma, purging, supplying a first reactant gas on the first source layer, and forming the third plasma before the step of forming a second source layer.

14. The substrate processing method of claim 12, further comprising forming a second gap-fill layer by changing the chemical properties of the second source layer, wherein forming the second gap-fill layer comprises supplying a second reactant gas on the second source layer and forming a plasma, wherein the second reactant gas comprises at least one of nitrogen and oxygen.

15. The substrate processing method of claim 14, further comprising removing at least a portion of the second source layer by supplying hydrogen plasma on the second source layer between the forming of the second source layer and the forming of the second gap-fill layer.

16. The substrate processing method of claim 1, wherein the first reactant gas consists of diatomic nitrogen ($N_2$).

17. A substrate processing method comprising:
performing a first cycle a plurality of times to form a first source layer on a substrate, wherein the first cycle consists essentially of:
supplying a first source gas to the substrate, and
purging the first source gas;
forming a hydrogen plasma comprising hydrogen radicals and supplying the hydrogen plasma on the first source layer to remove at least a portion of the first source layer by the hydrogen radicals,
after forming the hydrogen plasma, purging the residual hydrogen radicals or ions;
after purging the residual hydrogen radicals or ions and after at least a portion of the first source layer is removed, forming a first gap-fill layer from the first source layer by changing the chemical properties of the first source layer, wherein forming the first gap-fill layer comprises supplying a first reactant gas consisting of diatomic nitrogen ($N_2$) on the first source layer, wherein the first reactant gas consists of diatomic nitrogen ($N_2$);
purging the first reactant gas;
after forming the first gap-fill layer, forming a second source layer by supplying a second source gas on the first gap-fill layer;
purging the second source gas;
after forming the second source layer, forming a second gap-fill layer from the second source layer by changing the chemical properties of the second source layer, wherein forming the second gap-fill layer comprises supplying a second reactant gas on the second source layer, wherein the second reactant gas comprises at least one of nitrogen and oxygen.

18. The substrate processing method of claim 1, comprising repeating the steps of supplying a first source gas and a first inert gas, stopping the supply of the first source gas and continuing supply of the first inert gas, and forming a first inert gas plasma before the step of forming a hydrogen plasma.

* * * * *